(12) United States Patent
Kawata et al.

(10) Patent No.: US 11,740,311 B2
(45) Date of Patent: Aug. 29, 2023

(54) MAGNETIC RESONANCE IMAGING APPARATUS, IMAGE PROCESSING APPARATUS, AND IMAGE PROCESSING METHOD

(71) Applicant: FUJIFILM Healthcare Corporation, Chiba (JP)

(72) Inventors: Yasuo Kawata, Chiba (JP); Kuniaki Harada, Chiba (JP)

(73) Assignee: FUJIFILM Healthcare Corporation, Chiba (JP)

( * ) Notice: Subject to any disclaimer, the term of this patent is extended or adjusted under 35 U.S.C. 154(b) by 27 days.

(21) Appl. No.: 17/457,936

(22) Filed: Dec. 7, 2021

(65) Prior Publication Data

US 2022/0179027 A1 Jun. 9, 2022

(30) Foreign Application Priority Data

Dec. 7, 2020 (JP) ................................. 2020-202862

(51) Int. Cl.
*G01R 33/56* (2006.01)
*G01R 33/54* (2006.01)
*G06T 15/08* (2011.01)

(52) U.S. Cl.
CPC ....... *G01R 33/5608* (2013.01); *G01R 33/543* (2013.01); *G06T 15/08* (2013.01); *G06T 2210/41* (2013.01)

(58) Field of Classification Search
CPC .............. G01R 33/5608; G01R 33/543; G01R 33/4822; G01R 33/5635; G06T 15/08; G06T 2210/41; G06T 17/00; A61B 5/055; A61B 5/0042; A61B 5/72; A61B 2576/026
See application file for complete search history.

(56) References Cited

U.S. PATENT DOCUMENTS

2014/0375631 A1* 12/2014 Masumoto ........... A61B 8/0891
345/419

FOREIGN PATENT DOCUMENTS

JP 2012-100955 5/2012
JP 2020-039507 3/2020

\* cited by examiner

*Primary Examiner* — Gregory H Curran
(74) *Attorney, Agent, or Firm* — Paul Teng

(57) ABSTRACT

A volume rendering image is obtained based on a 3D MRI image by automatically performing appropriate opacity setting. A three-dimensional image of a subject is received, a distribution of pixel values of the three-dimensional image is calculated, a pixel value of a predetermined feature amount is calculated based on the distribution of the pixel values, and opacity is set for each of the pixel value included in the three-dimensional image based on the pixel value of the feature amount. Accordingly, the opacity can be set automatically. The volume rendering image of the three-dimensional image is generated using the opacity.

15 Claims, 9 Drawing Sheets

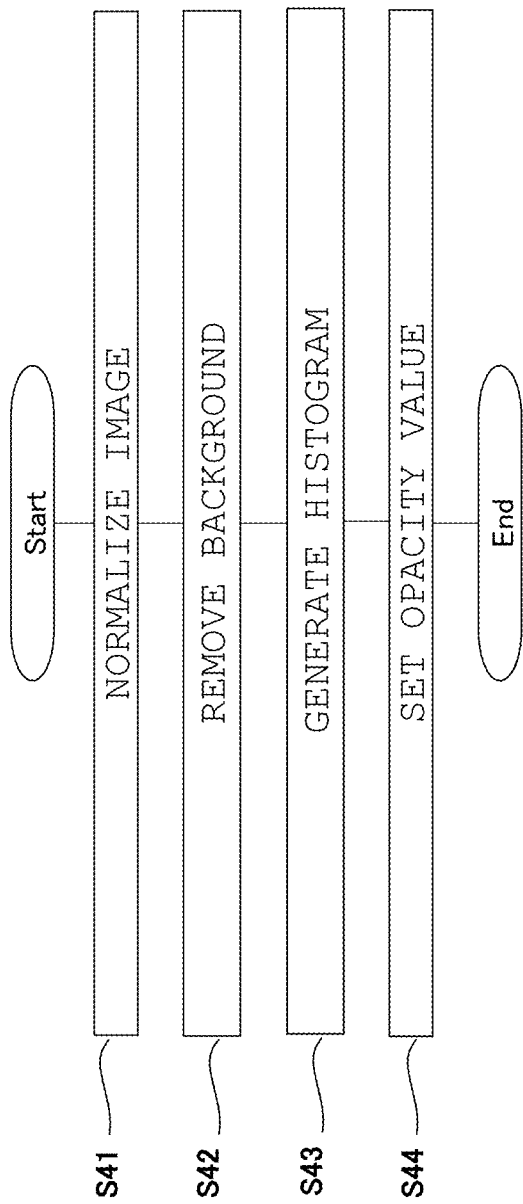

3D TOF IMAGE

AUTOMATIC CLIPPING

VOLUME RENDERING IMAGE OBTAINED AFTER AUTOMATIC OPACITY SETTING

MAGNETIC RESONANCE IMAGING APPARATUS, IMAGE PROCESSING APPARATUS, AND IMAGE PROCESSING METHOD

BACKGROUND OF THE INVENTION

1. Field of the Invention

The present invention relates to a technique for creating a volume rendering image of a desired tissue based on a three-dimensional (3D) image captured by a magnetic resonance imaging (hereinafter referred to as "MRI") apparatus or the like.

2. Description of the Related Art

An MRI apparatus is an apparatus that measures a nuclear magnetic resonance (NMR) signal generated by atomic nuclear spins of atoms constituting a subject, particularly a tissue of a human body, and two-dimensionally or three-dimensionally images forms or functions of a head, an abdomen, four limbs, and the like of the human body. When the imaging is performed, the NMR signal is phase-encoded and frequency-encoded differently depending on gradient magnetic fields, and is measured as time series data. The measured NMR signal is reconstructed into an image by being subject to two-dimensional or three-dimensional Fourier transform.

For image diagnosis of a lesion of a cerebral blood vessel such as a cerebral aneurysm, a method is used in which a high signal image of the cerebral blood vessel is obtained by imaging the cerebral blood vessel by a 3D time of flight (TOF) sequence instead of using a contrast agent. By projecting an obtained 3D TOF image at a desired angle by a maximum intensity projection (MIP) method, a blood vessel image can be seen from the desired angle. Before the projection by the MIP method, a signal of an unnecessary tissue other than a blood vessel to be observed, such as subcutaneous fat and a spreadsheet blood vessel, is removed (clipping-processed), then, an opacity is set such that pixels of cerebral parenchyma are transparent and not displayed, and thereby an image in which a morphology of the cerebral blood vessel can be observed more clearly can be obtained. However, the clipping processing and the opacity setting are manually performed, which is complicated and time-consuming.

Therefore, in order to automatically perform clipping processing, JP-A-2020-39507 (Patent Literature 1) discloses a technique of generating a brain extraction mask image obtained by extracting a brain region and a blood vessel mask image obtained by extracting a blood vessel region by performing image processing on a 3D MRI image, and extracting the brain region and an image of a blood vessel in a brain from the 3D image using a mask obtained by integrating the two mask images. With this method, a blood vessel in the brain region and a blood vessel on a scalp bottom side, which are necessary for observation of a cerebral blood vessel, can be extracted (clipped) from one 3D MRI image.

Meanwhile, JP-A-2012-100955 (Patent Literature 2) discloses a technique of identifying a contour of a brain in an X-ray CT image, acquiring intensities of NMR signals of pixels located on the contour of the brain in a corresponding MRI image, and setting, based on the signal intensities, an opacity curve such that the pixels of the contour of the brain are displayed in an opaque way and the other regions are displayed in a transparent way. The opacity curve indicates a relationship between an NMR signal value and opacity of a display pixel value, and specifically, a range of an MRI value indicated by the pixel of the contour of the brain is set to opacity 1, and a range of the other MRI values is set to opacity 0. Accordingly, only a contour portion of the brain can be displayed as a pseudo three-dimensional image.

The technique of Patent Literature 1 is a technique for automatically performing the clipping processing, and when a volume rendering image is to be created, it is necessary to manually set the opacity.

Meanwhile, in the method of Patent Literature 2, the two types of images including the X-ray CT image and the MRI image are necessary. Further, the method of Patent Literature 2 is an opacity setting method in which only the MRI signal indicated by the contour region of the brain is displayed in an opaque way, and there is no disclosure of a method in which the opacity is set such that only a contour of a blood vessel of the brain is displayed in an opaque way. Since a shape of the blood vessel of the brain is more complex than a contour shape of the brain, it is assumed that it is not easy to set the opacity of the blood vessel by the technique of Patent Literature 2.

Further, since the method of Patent Literature 2 does not perform the clipping processing, when the method of Patent Literature 2 is applied to the opacity setting of the blood vessel of the brain, a signal of an unnecessary tissue other than a blood vessel to be observed, such as subcutaneous fat and a spreadsheet blood vessel, remains in the MRI image, and complicated clipping is necessary.

Further, assuming that the clipping processing of Patent Literature 1 and the opacity processing of Patent Literature 2 are combined, the method of Patent Literature 2 sets the opacity based on a histogram of the NMR signal intensity of the contour pixel of a region to be extracted, whereas in the technique of Patent Literature 1, since the brain and cerebral blood vessel image are extracted from the 3D image using the integrated mask and clipping processing is performed to remove the unnecessary tissue, a histogram of an NMR signal intensity changes with respect to a histogram before the clipping. Therefore, based on the histogram of the changed MRI signal intensity, appropriate opacity may not be set for evaluation of the blood vessel.

SUMMARY OF THE INVENTION

An object of the invention is to obtain, based on a 3D MRI image, a volume rendering image by automatically performing appropriate opacity setting.

In order to achieve the above object, a magnetic resonance imaging apparatus according to the invention includes: a static magnetic field generation unit configured to generate a static magnetic field in a space in which an portion to be imaged of a subject is disposed; a measurement control unit configured to apply a gradient magnetic field and a high frequency magnetic field to the subject and to detect a nuclear magnetic resonance signal generated from the portion to be imaged; and an arithmetic processing unit configured to reconstruct a three-dimensional image of the subject using the detected nuclear magnetic resonance signal. The arithmetic processing unit obtains a distribution of pixel values of the three-dimensional image, calculates a pixel value of a predetermined feature amount based on the distribution of the pixel values, and sets opacity for each of the pixel values included in the three-dimensional image based on the pixel value of the feature amount.

According to the invention, since an appropriate opacity can be automatically set, an MRI volume rendering image can be automatically created based on a 3D MRI image. Therefore, an amount of complicated operations performed by an operator is reduced, which improves efficiency.

BRIEF DESCRIPTION OF THE DRAWINGS

FIG. 4 is a flowchart showing processing of opacity setting of the arithmetic processing unit according to the first embodiment of the invention.

DESCRIPTION OF THE PREFERRED EMBODIMENTS

Figure 1:
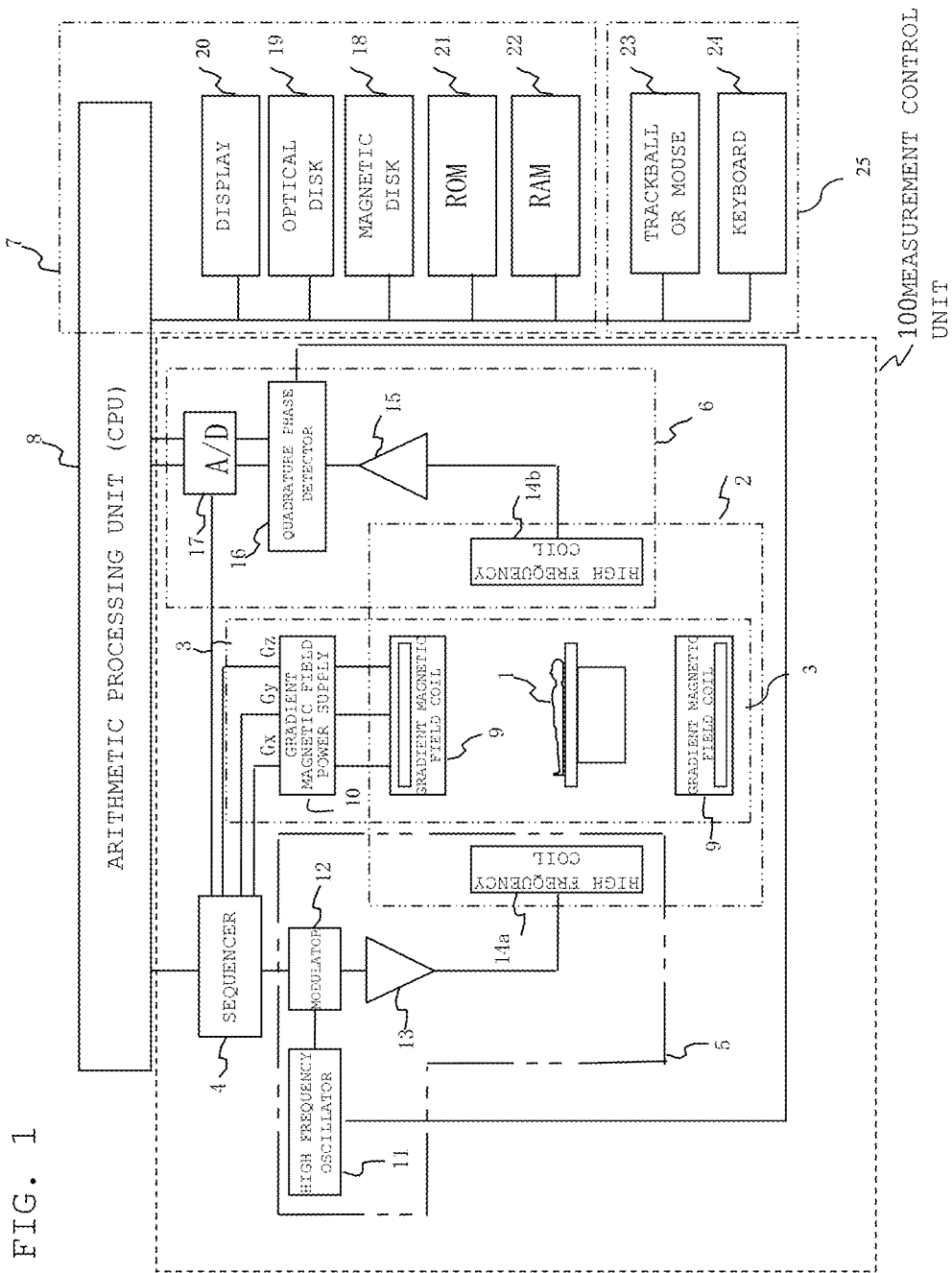
FIG. 1 is a block diagram showing an example of an overall configuration of an MRI apparatus according to the invention.

Preferred embodiments of an MRI apparatus of the invention will be described in detail below with reference to the accompanying drawings. In all the drawings for showing the embodiments of the invention, components having the same functions are denoted by the same reference numerals, and repeated description thereof will be omitted.

The MRI apparatus of the present embodiment captures a 3D TOF image, automatically performs clipping processing and opacity setting, and creates an optimal volume rendering image.

First, an overall outline of an example of the MRI apparatus according to the invention will be described with reference to FIG. 1. FIG. 1 is a block diagram showing an overall configuration of the MRI apparatus according to an embodiment of the invention. The MRI apparatus uses an NMR phenomenon to obtain a tomographic image of a subject, and as shown in FIG. 1, the MRI apparatus includes a static magnetic field generation unit 2, a gradient magnetic field generation unit 3, a transmission unit 5, a reception unit 6, a signal processing unit 7, a sequencer 4, and an arithmetic processing unit (CPU) 8. The gradient magnetic field generation unit 3, the transmission unit 5, the reception unit 6, and the sequencer 4 are collectively referred to as a measurement control unit 100.

The static magnetic field generation unit 2 generates a static magnetic field in a space in which a portion to be imaged of a subject 1 is disposed. The static magnetic field generation unit 2 is a permanent magnet type, normal conduction type, or superconducting type static magnetic field generation source disposed around the subject 1. The static magnetic field generation source generates a uniform static magnetic field in a direction orthogonal to a body axis of the subject 1 in a case of a vertical magnetic field system, and in a body axis direction of the subject 1 in a case of a horizontal magnetic field system.

The gradient magnetic field generation unit 3 includes gradient magnetic field coils 9 that apply gradient magnetic fields in three axial directions of X, Y, and Z, which are coordinate units (stationary coordinate units) of the MRI apparatus, and a gradient magnetic field power supply 10 that drives the gradient magnetic field coils, and applies gradient magnetic fields Gx, Gy, and Gz in the three axial directions of X, Y, and Z by driving the gradient magnetic field power supply 10 of the coils in accordance with a command from the sequencer 4 to be described later. At the time of imaging, a slice plane of the subject 1 is set by applying a slice selection gradient magnetic field pulse (Gs) in a direction orthogonal to the slice plane (imaging cross section), and a phase encoding gradient magnetic field pulse (Gp) and a frequency encoding gradient magnetic field pulse (Gf) are applied in remaining two directions, which are orthogonal to the slice plane and are orthogonal to each other, to encode position information in each direction in an echo signal.

The transmission unit 5 emits a high frequency magnetic field pulse (hereinafter referred to as "RF pulse") to the subject 1 in order to cause nuclear magnetic resonance in atomic nuclear spins of atoms constituting a biological tissue of the subject 1, and includes a high frequency oscillator 11, a modulator 12, a high frequency amplifier 13, and a transmission-side high frequency coil (transmission coil) 14a. The RF pulse output from the high frequency oscillator 11 is amplitude-modulated by the modulator 12 at a timing according to a command from the sequencer 4 to be described later, and the amplitude-modulated RF pulse is amplified by the high frequency amplifier 13 and then supplied to the high frequency coil 14a disposed close to the subject 1. Accordingly, the RF pulse is emitted from the high frequency coil 14a to the subject 1.

The reception unit 6 detects an echo signal (hereinafter referred to as an NMR signal) emitted by the nuclear magnetic resonance (NMR) of the automatic nuclear spins of atoms constituting the biological tissue of the subject 1, and includes a reception-side high frequency coil (reception coil) 14b, a signal amplifier 15, a quadrature phase detector 16, and an A/D converter 17.

The NMR signal of response of the subject 1 induced by an electromagnetic wave emitted from the transmission coil 14a is detected by the reception coil 14b disposed close to the subject 1, amplified by the signal amplifier 15, and then divided into two signals orthogonal to each other by the quadrature phase detector 16 at a timing according to a command from the sequencer 4, and each of the two signals is converted into a digital amount by the A/D converter 17 and transmitted to the signal processing unit 7.

The sequencer 4 is a control unit for repeatedly applying the RF pulse and the gradient magnetic field pulse in accordance with a predetermined pulse sequence, and receiving the NMR signal generated thereby at a predetermined timing. The sequencer 4 operates under control of the arithmetic processing unit 8, transmits various commands to the transmission unit 5, the gradient magnetic field generation unit 3, and the reception unit 6 in accordance with the pulse sequence, and collects NMR signal data necessary for generating the tomographic image of the subject 1.

The signal processing unit 7 performs various kinds of data processing and displays and stores processing results, and includes an external storage device such as an optical disk 19 and a magnetic disk 18, and a display 20 such as a CRT.

When the NMR signal data from the reception unit 6 is input into the arithmetic processing unit (CPU) 8, the arithmetic processing unit 8 performs signal processing and processing such as image reconstruction to reconstruct the tomographic image of the subject 1. The arithmetic processing unit 8 displays the tomographic image of the subject 1 on the display 20 and records the tomographic image on the magnetic disk 18 or the like of the external storage device.

An operation unit 25 inputs various kinds of control information of the MRI apparatus and control information of the processing performed by the signal processing unit 7, and includes a trackball or a mouse 23 and a keyboard 24. The operation unit 25 is disposed close to the display 20, and an operator interactively controls various kinds of processing of the MRI apparatus through the operation unit 25 while viewing the display 20.

In FIG. 1, the transmission-side high frequency coil 14a and the gradient magnetic field coils 9 are provided in a static magnetic field space of the static magnetic field generation unit 2 into which the subject 1 is disposed so as to face the subject 1 in the case of the vertical magnetic field system and surround the subject 1 in the case of the horizontal magnetic field system. Meanwhile, the reception-side high frequency coil 14b is provided so as to face or surround the subject 1. As described above, the gradient magnetic field generation unit 3, the transmission unit 5, the reception unit 6, and the sequencer 4 are collectively referred to as the measurement control unit 100.

Currently, an imaging target nuclide of the MRI apparatus is a hydrogen nucleus (proton), which is a main constituent substance of the subject, as a substance widely used in clinical practice. By imaging information on a spatial distribution of a proton density and information on a spatial distribution of a relaxation time of an excited state, forms or functions of a head, an abdomen, four limbs, and the like of the human body are imaged two-dimensionally or three-dimensionally.

Figure 2:
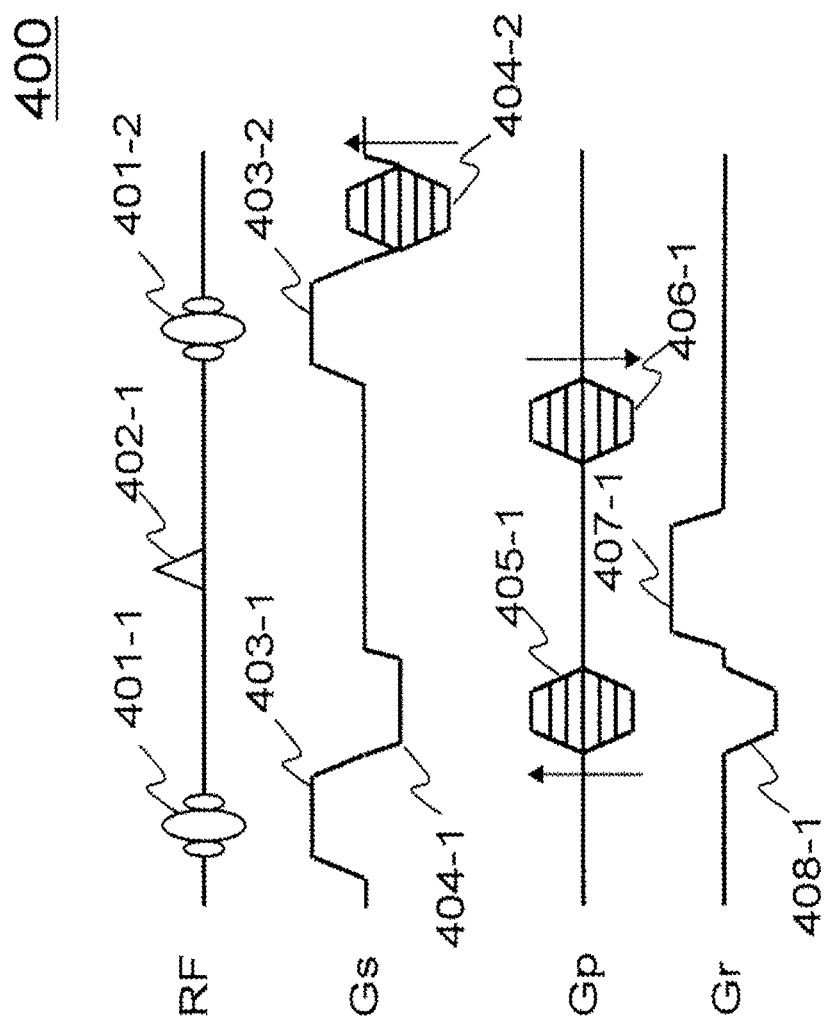
FIG. 2 is an example of a 3D TOF imaging pulse sequence.

Examples of a method for imaging a cerebral blood vessel using the MRI include a pulse sequence of a 3D time of flight (TOF) method. FIG. 2 is an example of a sequence diagram of the 3D TOF method. In FIG. 2, RF indicates an application timing of an RF pulse 401 and an acquisition timing of an NMR signal 402, and Gs, Gp, and Gr indicate application timings and the magnitudes of gradient magnetic field pulses 403 to 408 in a slice direction, a phase encoding direction, and a reading direction. A number after a hyphen after three-digit number is a number indicating the number of repetitions. For example, "1" of 402"-1" indicates a pulse applied in a first repetition and a signal acquired in the first repetition, and "2" of "-2" indicates a pulse applied in a second repetition and a signal acquired in the second repetition. That is, in the pulse sequence of the 3D TOF method in FIG. 2, a sequence of emitting the RF pulse 401 while applying the gradient magnetic field pulse 403 in the slice direction Gs, then applying the gradient magnetic field pulse 404 in the slice direction Gs, the gradient magnetic field pulse 405 in the phase encoding direction Gp, and the gradient magnetic field pulse 408 in the read direction Gr, and then receiving the NMR signal 402 while applying the gradient magnetic field pulse 407 in the reading direction is repeated a predetermined number of times. For each repetition, the magnitude of the gradient magnetic field pulse 404 in the slice direction Gs is changed, and the magnitudes of the gradient magnetic field pulses 405 and 406 in the phase encoding direction Gp are changed, and thereby a slice position and the phase encoding are changed, and the NMR signal necessary for generating the 3D TOF image is acquired.

Hereinafter, in the MRI apparatus of the present embodiment, processing in which, based on the 3D TOF image, the arithmetic processing unit 8 automatically performs the clipping process and opacity setting to generate the volume rendering image will be described. The processing performed by the arithmetic processing unit 8 of each embodiment is image processing, and the arithmetic processing unit 8 functions as an image processing apparatus.

First Embodiment

Figure 5A:
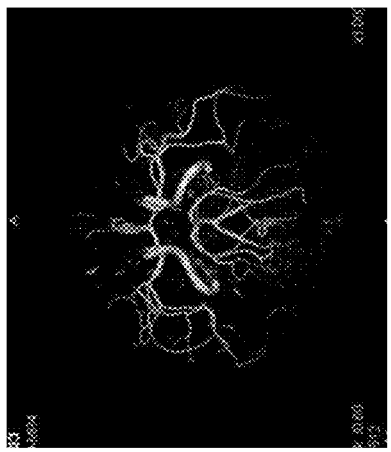
FIG. 5A to 5C are diagrams showing images before, during, and after processing according to the first embodiment of the invention.
Figure 5B:
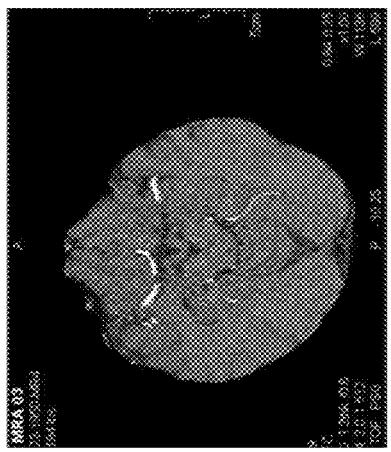
Figure 5C:
Figure 6:
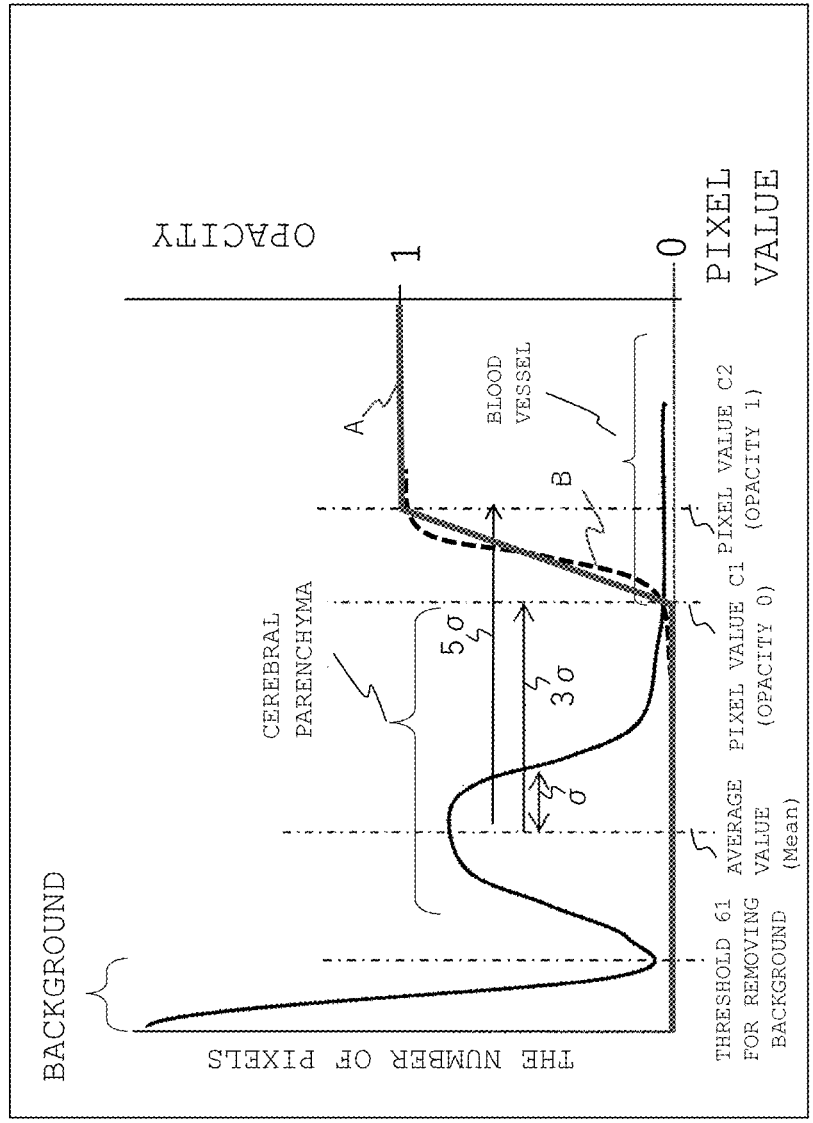
FIG. 6 is a graph showing a histogram generated for the opacity setting of the arithmetic processing unit according to the first embodiment of the invention and an opacity curve.

Clipping processing and opacity setting processing of an MRI apparatus according to a first embodiment will be described in detail with reference to flowcharts of FIGS. 3 and 4. Further, FIGS. 5A to 5C show images under the processing, and FIG. 6 shows a histogram of a pixel value.

In the first embodiment, the arithmetic processing unit 8 obtains a distribution of pixel values of a three-dimensional image (3D TOF image), calculates a pixel value of a predetermined feature amount based on the distribution of the pixel values, and sets an opacity for each pixel value included in the three-dimensional image based on the pixel value of the feature amount. When a portion to be imaged is a brain, the arithmetic processing unit 8 sets the opacity for each pixel value such that the opacity is set to 0 in a range of a pixel value corresponding to a cerebral parenchyma image of the three-dimensional image and the opacity is set to 1 in a range of a pixel value corresponding to a blood vessel image.

Specifically, an average value of the distribution of the pixel values of the three-dimensional image is used as the pixel value of the feature amount. The arithmetic processing unit 8 sets an opacity curve in which the opacity changes from 0 to 1 as a pixel value increases, with a pixel value larger than the pixel value (average value) of the feature amount by a predetermined value as a boundary. For example, the predetermined value is set based on a variance ($\sigma$) calculated based on the distribution of the pixel values.

More specifically, the arithmetic processing unit 8 sets an opacity curve in which an opacity linearly or nonlinearly changes from 0 to 1 with a pixel value larger than the pixel value of the feature amount by a predetermined value ($3\sigma$) as a boundary.

Hereinafter, processing of the arithmetic processing unit 8 will be described in more detail.

Figure 3:
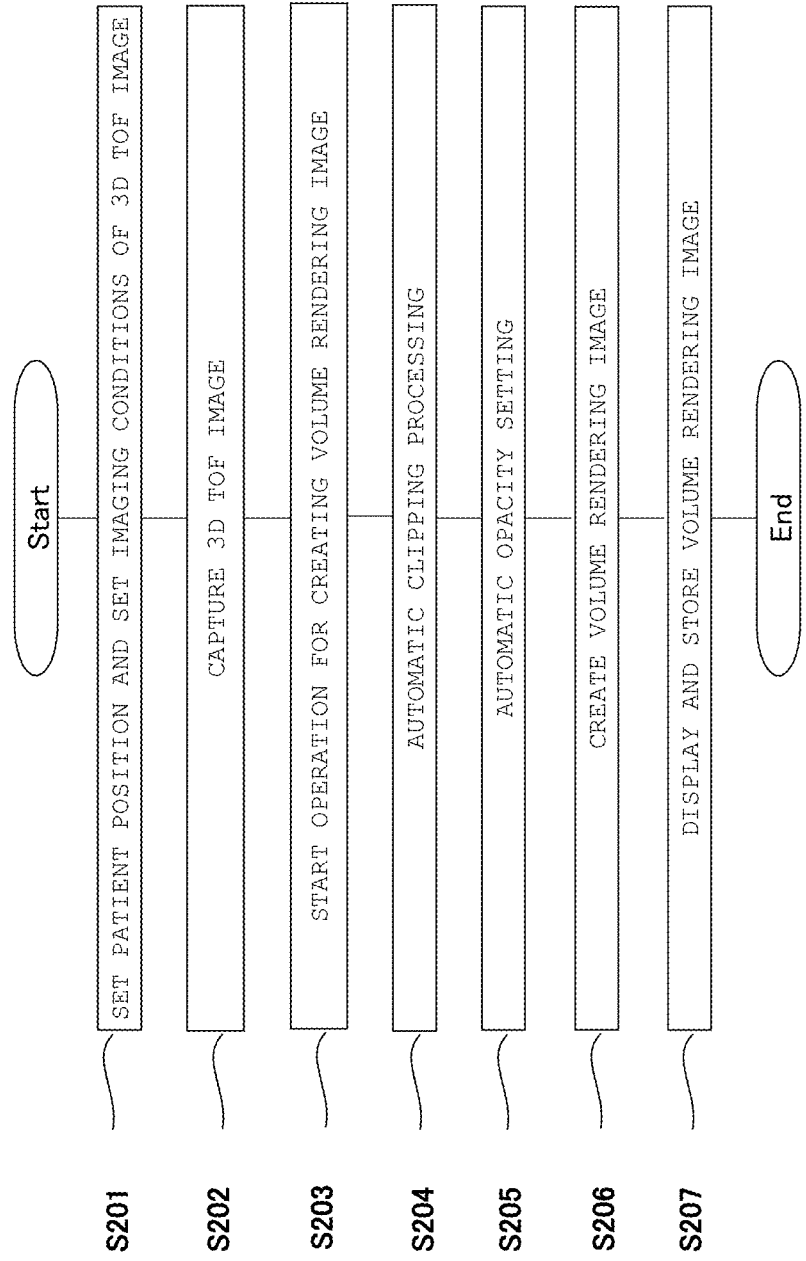
FIG. 3 is a flowchart showing processing of an arithmetic processing unit according to a first embodiment of the invention.

Processing flows of the arithmetic processing unit 8 shown in FIGS. 3 and 4 are stored in advance in the magnetic disk 18 as a program, and are implemented by software by the arithmetic processing unit (CPU) 8 reading and executing the program from the magnetic disk 18. A part of or all the arithmetic processing unit 8 may be implemented by hardware. For example, a custom IC such as an application specific integrated circuit (ASIC) or a programmable IC such as a field-programmable gate array (FPGA) may be used to configure a part of or all the arithmetic processing unit 8, and a circuit design may be performed so as to implement a function thereof.

(Step S201)

An operator sets up the portion to be imaged (here, the brain) of the subject 1 in a static magnetic field space generated by the static magnetic field generation unit 2. The arithmetic processing unit 8 receives a setting input of imaging conditions of a sequence for capturing the 3D TOF image from the operator via the operation unit 25.

(Step S202)

The arithmetic processing unit 8 instructs the sequencer 4 to execute a 3D TOF pulse sequence of FIG. 2 under the imaging conditions set in step S201. Accordingly, the imaging by the 3D TOF pulse sequence is performed on the subject 1. The arithmetic processing unit 8 processes an acquired NMR signal to reconstruct the 3D TOF image. Generated image data is stored in the magnetic disk 18. Here, for example, an image of the brain is captured.

(Step S203)

The arithmetic processing unit 8 receives selection of a 3D TOF image (FIG. 5A) to be processed from images stored in the magnetic disk 18 from the operator via the operation unit 25. The arithmetic processing unit 8 starts processing of creating a volume rendering image for the selected 3D TOF image. A configuration may be adopted in which step S203 is not performed, and when the capturing of the image is completed in step S202, the arithmetic processing unit 8 selects the captured image as a processing target.

(Step S204)

The arithmetic processing unit 8 automatically performs clipping processing (FIG. 5B) on the 3D TOF image acquired in step S202 with a known method. In the present embodiment, for example, by a method of Patent Literature 1, a subcutaneous fat region, a skull region, and the like are removed to obtain an image including a cerebral parenchyma region including a blood vessel and a blood vessel at a scalp bottom portion.

(Step S205)

The arithmetic processing unit 8 calculates opacity for the clipping-processed 3D TOF image acquired in step S204. Processing of step S205 will be described in detail with reference to a flow of FIG. 4.

(Step S41)

The arithmetic processing unit 8 normalizes the clipping-processed 3D TOF image. For example, the normalization is performed such that a signal value (pixel value) falls within a range of 0 to 255.

(Step S42)

The arithmetic processing unit 8 calculates, by a discriminant analysis method, a degree of separation of the pixel value of the 3D TOF image normalized by a threshold (see FIG. 6) for removing a background region so as to maximize the degree of separation, and removes the background region of the 3D TOF image by replacing pixel values equal to or less than the threshold 61 with 0.

(Step S43)

The arithmetic processing unit 8 generates a histogram (distribution of pixel values) of the pixel value and the number of pixels of the 3D TOF image from which the background region is removed. An example of the histogram is shown in FIG. 6. The 3D TOF image from which the background region is removed is substantially configured with images of a cerebral parenchyma region and a blood vessel region. The 3D TOF image from which the background region is removed has such characteristics that pixels in the blood vessel region have a large signal value but the number of pixels thereof is small, pixels in the cerebral parenchyma region have a signal value smaller than that of the blood vessel region but the number of pixels is significantly larger than that of the blood vessel region. Therefore, in the histogram of the pixel value of the 3D TOF image from which the background region is removed, as shown in FIG. 6, the pixels of the cerebral parenchyma have a distribution with a peak, and the pixels of the blood vessel region are distributed in a region having pixel values larger than that of the distribution of the pixels of the cerebral parenchyma.

(Step S44)

In order to set the opacity to 0 (transparent) for a pixel value range of the cerebral parenchyma and set the opacity to 1 (opaque) for the pixels of the blood vessel, the arithmetic processing unit 8 calculates an average value (Mean) and a variance ($\sigma$) of the pixel value (signal value) as the feature amount of the histogram, sets the opacity to 0 (transparent) using a range from a minimum value 0 of the pixel value to a pixel value of Mean (average value)+$3\sigma$ (=pixel value C1) as the pixel value range of the cerebral parenchyma, and sets the opacity to a value larger than 0 using a range of pixel values larger than Mean+$3\sigma$ as a pixel value range of the blood vessel. Here, as shown in FIG. 6, an opacity curve A is set in which the opacity is 0 in a range in which the pixel value is equal to or less than Mean (average value)+$3\sigma$ (=pixel value C1), the opacity changes linearly or nonlinearly from 0 to 1 in a range from Mean+$3\sigma$ (=pixel value C1) to Mean+$5\sigma$ (=pixel value C2), and the opacity is 1 (opaque) in a range in which the pixel value is equal to or larger than Mean+$5\sigma$ (=pixel value C2). FIG. 6 shows, for example, the opacity curve A in which a value of the opacity increases linearly (in proportion to the pixel value) in a range from Mean+$3\sigma$ (=the pixel value C1) to Mean+$5\sigma$ (=the pixel value C2).

(Step S206)

The arithmetic processing unit 8 creates the volume rendering image using the clipped 3D TOF image acquired in step S204. Here, the value of the opacity curve set in step S205 is used at the time of creating the volume rendering image. That is, for each pixel of the clipped 3D TOF image acquired in step S204, volume rendering is performed such that, when a pixel value of the pixel is between 0 and Mean+$3\sigma$, the opacity is set to 0, when the pixel value is equal to or larger than Mean (average value)+$5\sigma$, the opacity is set to 1, and transparency of the linear or non-linear opacity curve A is set for the pixels between 0 and the value equal to or larger than Mean (average value)+$5\sigma$. Accordingly, as shown in FIG. 5C, the volume rendering image of the blood vessel image can be obtained with the pixels of the cerebral parenchyma being transparent.

(Step S207)

The arithmetic processing unit 8 displays, on the display 20, the volume rendering image that is calculated in step S206 after the clipping is performed and the opacity is set, and stores the image.

As described above, in the first embodiment, based on the 3D TOF image, the arithmetic processing unit 8 can automatically perform the clipping processing and the opacity setting to automate the creation of the MRI volume rendering image. As a result, an amount of work of the operator is reduced, which improves efficiency.

In the above-described embodiment, in step 205, in the opacity setting as shown in FIG. 6, the opacity curve A is set in which the opacity changes from 0 to 1 for the pixel values between Mean (average value)+$3\sigma$ and Mean (average value)+$5\sigma$, and a sigmoid curve such as a curve B in FIG. 6 may be set.

Further, the opacity curve may be set such that the opacity value changes stepwise from 0 to 1 with the pixel value (for example, Mean (average value)+$3\sigma$) larger than the pixel value of the feature amount by a predetermined value as the boundary.

In the present embodiment, the average value (Mean) of the pixel values of the clipping-processed 3D image is set as the feature amount, and the pixel values C1 and C2 serving as the boundaries for changing the opacity are set based on the feature amount, whereas the feature amount may not necessarily be the average value. For example, a peak value of the histogram of FIG. 6 may be used as the feature amount, and pixel values separated from the peak value by predetermined values may be used as the pixel values C1 and C2.

Second Embodiment

Figure 7:
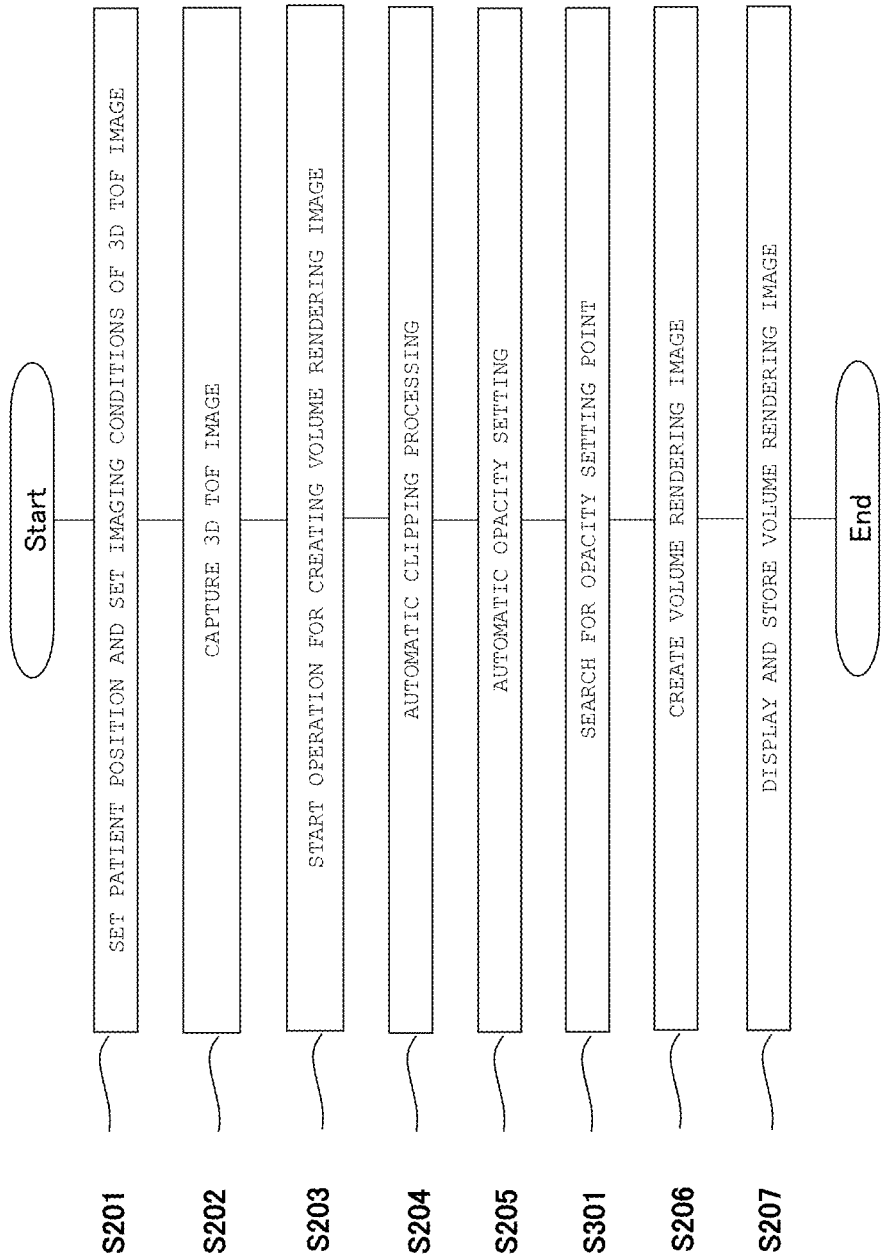
FIG. 7 is a flowchart showing processing of an arithmetic processing unit according to a second embodiment of the invention.

Clipping processing and opacity setting processing of an MRI apparatus according to a second embodiment will be described in detail with reference to a flowchart of FIG. 7.

The second embodiment is the same as the first embodiment in that the clipping processing and the opacity setting are automatically performed on a 3D TOF image to automate creation of an MRI volume rendering image. Further, in the second embodiment, a search is performed such that, by performing step S301 between step S205 and step S206 in the flow of FIG. 3 of the first embodiment, the pixel values C1 and C2 serving as boundaries for changing opacity from 0 to 1 are more optimal.

That is, the arithmetic processing unit 8 sets a plurality of opacity curves while shifting the pixel values C1 and C2 serving as the boundaries, performs an arithmetic operation on distribution of pixel values of a three-dimensional image using the plurality of opacity curves, and selects one opacity curve based on an arithmetic operation result.

Hereinafter, a specific description will be given with reference to a flow of FIG. 7. In FIG. 7, the same steps as those in the first embodiment are denoted by the same step reference numerals, and description thereof will be omitted.
(Steps S201 to S205)

Since steps S201 to S205 in the second embodiment are the same as those in the first embodiment, the description thereof is omitted. In step S205, the opacity curve A in which the opacity linearly changes from 0 to 1 for the pixel values between an average value of the pixel values Mean+(=pixel value C1) and the average value Mean+50 (=pixel value C2) is set based on a histogram of the pixel values of the 3D TOF image.
(Step S301)

The arithmetic processing unit 8 further explanatorily determines the pixel values C1 and C2 for changing the opacity from 0 to 1. For example, the opacity curve A is set in which the opacity changes, for example, linearly from 0 to 1 while changing (shifting) values of the pixel values C1 and C2 (C1=Mean+3σ, C2=Mean+5σ) for changing the opacity from 0 to 1 using values of the pixel values C1 and C2 determined in step S205 as initial values. For example, in the search for C1, the search is performed such that step S206 is performed while changing the value of C1 to obtain a volume rendering image as shown in FIG. 5C, a volume of a region remaining in the volume rendering image is calculated, and a change amount thereof as a feature amount. Specifically, the pixel value C1 is used as the initial value, the change amount of the volume remaining in the volume rendering image obtained by performing step S206 each time the pixel value is changed is obtained, and when the change amount is smaller than a predetermined threshold, a pixel value at that time is determined as a value of the C1 of the opacity curve A. Accordingly, a more appropriate pixel value C1 by which a cerebral parenchyma image does not remain and only the blood vessel remains in the volume rendering image can be determined.

Similarly, while changing the pixel value C2 in the same manner, step S206 is performed to obtain the volume rendering image, the volume of the region remaining in the volume rendering image is calculated, and when the change amount is smaller than a predetermined threshold, a pixel value at that time is determined as a value of the C2 of the opacity curve A.

Accordingly, the appropriate pixel values C1 and C2 by which only the blood vessel remains in the volume rendering image can be set.

In step S301, instead of the volume of the region remaining in the volume rendering image, an area of a predetermined cross section of the volume rendering image or an area of a two-dimensional image obtained by projecting the volume rendering image onto a predetermined plane may be used, and the pixel values C1 and C2 can be searched for using a change amount of the area as the feature amount.

Further, a searching method is not limited to these methods, the set opacity curve A and the histogram may be integrated, and the pixel values C1 and C2 in which an area of a histogram curve after the integration corresponds to a predetermined area range of only a main blood vessel may be searched for.
(Steps S206 and S207)

The volume rendering image is created using the pixel values calculated in step S301. A method is the same as that of the first embodiment.

As described above, in the second embodiment of the invention, based on the 3D TOF image, the arithmetic processing unit 8 searches for the pixel values for automatically performing the clipping processing and the opacity setting, sets the more optimal opacity, and automates the creation of the MRI volume rendering image. Accordingly, the volume rendering image in which the more optimal opacity is set can be obtained.

In the second embodiment, instead of the linear opacity curve A, the curve B such as a sigmoid curve described in the first embodiment may be used.

Third Embodiment

Figure 8:
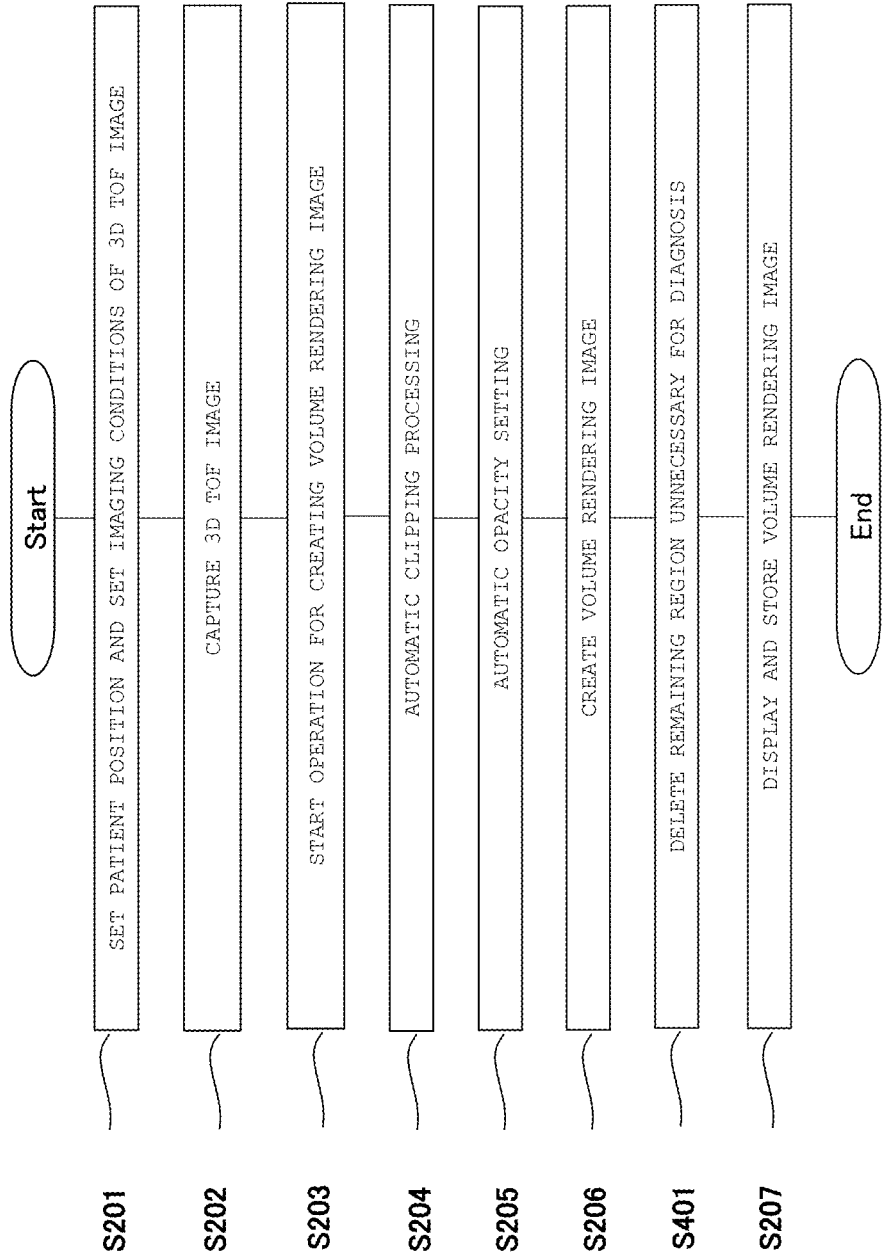
FIG. 8 is a flowchart showing processing of an arithmetic processing unit according to a third embodiment of the invention.

Processing of a 3D TOF image performed by an MRI apparatus according to a third embodiment will be described in detail with reference to a flowchart of FIG. 8.

In the third embodiment, similarly to the first embodiment, clipping processing and opacity setting are automatically performed on a 3D TOF image to automate creation of an MRI volume rendering image, but a region remaining after volume rendering and unnecessary for evaluation is deleted by performing step S401 between step S206 and step S207 in the flow of FIG. 3 of the first embodiment.

That is, the arithmetic processing unit 8 performs processing of extracting an unnecessary region by performing predetermined image processing on the volume rendering image and deleting the extracted unnecessary region. For example, as the predetermined image processing, processing of extracting a discontinuous region is performed.

The processing will be described specifically with reference to a flow of FIG. 8. In FIG. 8, the same steps as those in the first embodiment are denoted by the same step reference numerals, and description thereof will be omitted.
(Steps S201 to S206)

The volume rendering image is generated after the clipping and the opacity setting are automatically performed on the 3D TOF image, which is the same as the first embodiment and the description thereof will be omitted.

(Step S401)

The arithmetic processing unit 8 performs processing of deleting a region unnecessary for diagnosis, such as a subcutaneous fat region remaining in the volume rendering image. For example, all remaining regions are labeled, non-continuous regions are extracted, and the extracted regions are regarded as regions other than the blood vessel, and are deleted.

Further, a method of calculating a feature amount for each region of the volume rendering image, determining the regions other than the blood vessel based on the feature amount, and deleting the regions may be used.

Alternatively, a method may be used in which the regions other than the blood vessel are deleted based on image recognition using a learning model that learns in advance so as to distinguish between the blood vessel and the unnecessary region by machine learning using a large number of volume rendering images in advance.

(Step S207)

The volume rendering image obtained by deleting the unnecessary region is displayed and stored in the same manner as in the first embodiment.

As described above, in the third embodiment of the invention, based on the 3D TOF image, the arithmetic processing unit 8 can create the volume rendering image more suitable for the diagnosis while eliminating complicated work of the operator, by automatically performing the clipping processing and the opacity setting and further automatically deleting the remaining region unnecessary for the diagnosis.

Fourth Embodiment

Figure 9:
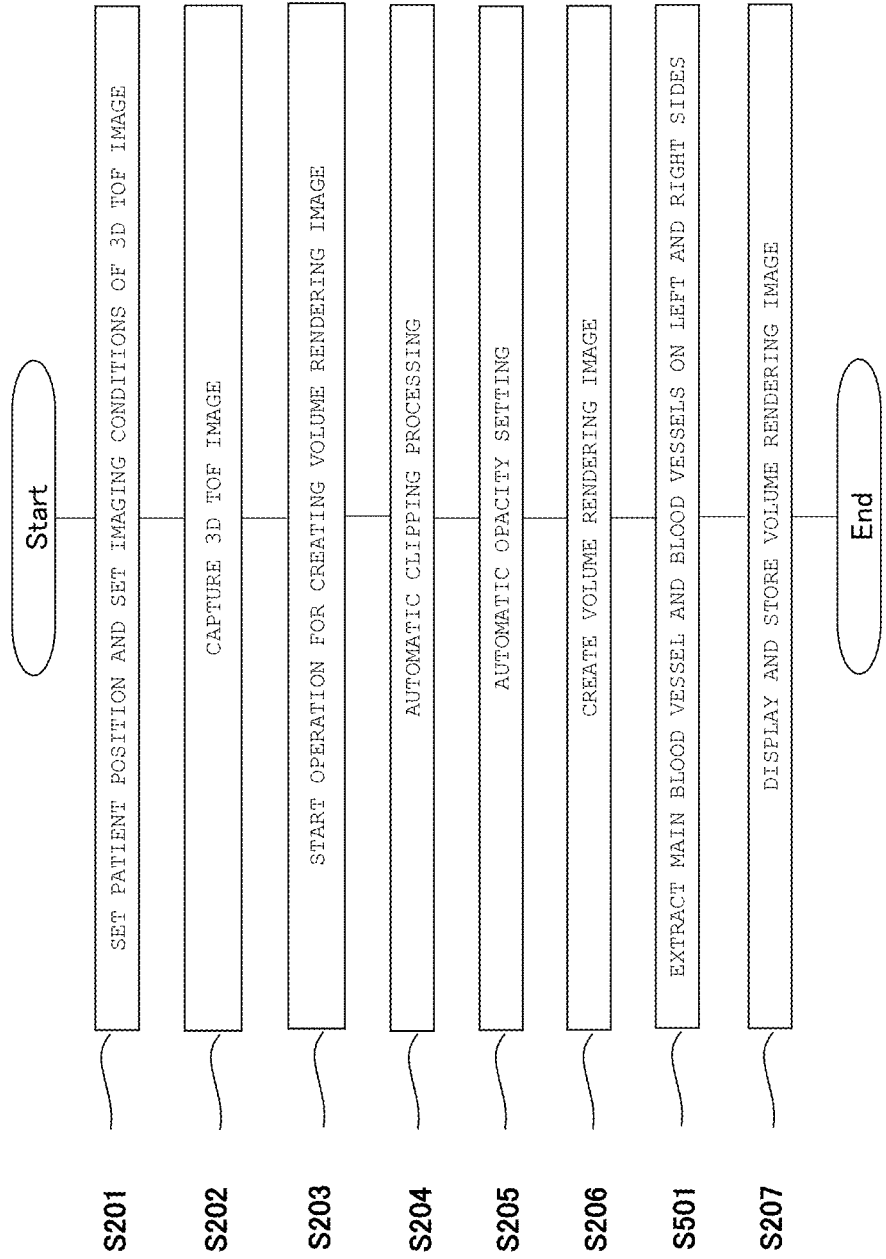
FIG. 9 is a flowchart showing processing of an arithmetic processing unit according to a fourth embodiment of the invention.

Processing of a 3D TOF image performed by an MRI apparatus according to a fourth embodiment will be described in detail with reference to a flowchart of FIG. 9.

In the fourth embodiment, similarly to the first embodiment, clipping processing and opacity setting are automatically performed on a 3D TOF image to automate creation of an MRI volume rendering image, but processing of extracting a predetermined specific blood vessel image from the volume rendering image is further performed by performing step S501 between step S206 and step S207 in the flow of FIG. 3 of the first embodiment. The specific blood vessel image is an image of a predetermined main blood vessel or a blood vessel on a left side or a right side of a subject.

The processing will be described specifically with reference to a flow of FIG. 9. In FIG. 9, the same steps as those in the first embodiment are denoted by the same step reference numerals, and description thereof will be omitted.

(Steps S201 to S206)

The volume rendering image is generated after the clipping and the opacity setting are performed automatically on the 3D TOF image, which is the same as the first embodiment and the description thereof will be omitted.

(Step S501)

The arithmetic processing unit 8 extracts, from the volume rendering image generated in step 206, a predetermined main blood vessel or a blood vessel on a left side and/or a blood vessel on a right side of a portion to be imaged (here, a brain) of the subject 1 to create a volume rendering image. Specifically, an initial point of the main blood vessel or the blood vessels on the left and right sides is extracted from the volume rendering image, and the blood vessel is extracted by tracing a blood vessel image from the initial point using continuity of the blood vessel.

For example, in a case of extracting the blood vessels on the left and right sides, an image position of DICOM information attached to an MRI image is obtained or a center position of the left and right sides of a body (brain) is obtained based on a patient position, a left side region and a right side region are set in the volume rendering image, a pixel having a highest signal value on the blood vessel in each of the left side region and the right side region is obtained as an initial point, and continuous pixels on the image are traced from the initial point by a region growing method or the like, thereby separately extracting a continuous blood vessel in the left side region and a continuous blood vessel in the right side region.

Further, in a case of extracting the main blood vessel, a plurality of blood vessels are sequentially extracted by repeating processing of first setting an initial point at a pixel having a largest pixel value, extracting the blood vessel from the initial point by the region growing method or the like using the continuity of the blood vessel, then setting an initial point on a pixel having a largest pixel value in the remaining image, and extracting a second blood vessel. After the plurality of extracted blood vessels are labeled, the position information and the continuity thereof are used to extract a largest continuous region that is regarded as the main blood vessel such as a medium cerebral artery, and a next largest continuous region that is regarded as a blood vessel such as a vertebra artery. The extraction of these blood vessels may be performed by labeling or the like by deep learning using a learned learning model.

(Step S207)

One or more volume rendering images from which a desired blood vessel is extracted are displayed and stored in the same manner as in the first embodiment.

As described above, in the fourth embodiment of the invention, based on the 3D TOF image, the arithmetic processing unit 8 can create the volume rendering image more suitable for diagnosis while eliminating complicated work of an operator, by automatically performing the clipping processing and the opacity setting and further automating the creation of the volume rendering images for the blood vessels on the left and right sides and for the main blood vessel.

Although the embodiments of the invention have been described above, it is needless to say that the invention is not limited thereto.

What is claimed is:

1. A magnetic resonance imaging apparatus comprising:
   a static magnetic field generation unit configured to generate a static magnetic field in a space in which a portion to be imaged of a subject is disposed;
   a measurement control unit configured to apply a gradient magnetic field and a high frequency magnetic field to the subject and to detect a nuclear magnetic resonance signal generated from the portion to be imaged; and
   an arithmetic processing unit configured to reconstruct a three-dimensional image of the subject using the detected nuclear magnetic resonance signal, wherein
   the arithmetic processing unit obtains a distribution of pixel values of the three-dimensional image, calculates a pixel value of a predetermined feature amount based on the distribution of the pixel values, and sets opacity for each of the pixel values included in the three-dimensional image based on the pixel value of the feature amount.

2. The magnetic resonance imaging apparatus according to claim 1, wherein
the pixel value of the feature amount is an average value of the distribution of the pixel values of the three-dimensional image.

3. The magnetic resonance imaging apparatus according to claim 1, wherein
the arithmetic processing unit sets an opacity curve in which the opacity changes from 0 to 1 as the pixel value increases, with a pixel value larger than the pixel value of the feature amount by a predetermined value as a boundary.

4. The magnetic resonance imaging apparatus according to claim 1, wherein
the arithmetic processing unit sets an opacity curve in which the opacity changes linearly or nonlinearly from 0 to 1 for pixel values between a pixel value C1 larger than the pixel value of the feature amount by a predetermined first value and a pixel value C2 larger than the pixel value of the feature amount by a predetermined second value.

5. The magnetic resonance imaging apparatus according to claim 3, wherein
the arithmetic processing unit sets the predetermined value based on a variance ($\sigma$) calculated based on the distribution of the pixel values.

6. The magnetic resonance imaging apparatus according to claim 1, wherein
the portion to be imaged is a brain, and
the arithmetic processing unit sets the opacity for each of the pixel values such that the opacity is set to 0 in a range of a pixel value corresponding to a cerebral parenchyma image of the three-dimensional image and the opacity is set to a value larger than 0 and equal to or smaller than 1 in a range of a pixel value corresponding to a blood vessel image.

7. The magnetic resonance imaging apparatus according to claim 1, wherein
the arithmetic processing unit performs clipping processing on the three-dimensional image before setting the opacity.

8. The magnetic resonance imaging apparatus according to claim 1, wherein
the arithmetic processing unit generates a volume rendering image of the three-dimensional image after setting the opacity.

9. The magnetic resonance imaging apparatus according to claim 3, wherein
the arithmetic processing unit sets a plurality of opacity curves while shifting the pixel value serving as the boundary, performs an arithmetic operation on the distribution of the pixel values of the three-dimensional image using the plurality of opacity curves, and selects one opacity curve based on an arithmetic operation result.

10. The magnetic resonance imaging apparatus according to claim 4, wherein
the arithmetic processing unit generates a volume rendering image of the three-dimensional image using the opacity of the opacity curve while shifting at least one of values of the pixel values C1 and C2 of the opacity curve, calculates a volume of an image remaining in the volume rendering image and/or an area of a two-dimensional image generated based on the volume rendering image, and determines, based on the volume and/or the area, the values of the pixel values C1 and/or C2 used for the opacity curve.

11. The magnetic resonance imaging apparatus according to claim 8, wherein
the arithmetic processing unit performs processing of extracting an unnecessary region, by performing predetermined image processing on the volume rendering image, and deleting the extracted unnecessary region.

12. The magnetic resonance imaging apparatus according to claim 11, wherein the predetermined image processing is processing of extracting a discontinuous region.

13. The magnetic resonance imaging apparatus according to claim 1, wherein
the arithmetic processing unit further performs processing of extracting a predetermined specific blood vessel image from a blood vessel image.

14. An image processing apparatus comprising:
an arithmetic processing unit configured to receive a three-dimensional image of a subject and perform arithmetic processing thereon, wherein
the arithmetic processing unit obtains a distribution of pixel values of the three-dimensional image, calculates a pixel value of a predetermined feature amount based on the distribution of the pixel values, sets opacity for each of the pixel values included in the three-dimensional image based on the pixel value of the feature amount and generates a volume rendering image of the three-dimensional image using the opacity.

15. An image processing method comprising:
receiving a three-dimensional image of a subject;
obtaining a distribution of pixel values of the three-dimensional image;
calculating a pixel value of a predetermined feature amount based on the distribution of the pixel values;
setting opacity for each of the pixel values included in the three-dimensional image based on the pixel value of the feature amount; and
generating a volume rendering image of the three-dimensional image using the opacity.

* * * * *